United States Patent [19]

Derouiche et al.

[11] Patent Number: 5,623,395
[45] Date of Patent: Apr. 22, 1997

[54] INTEGRATED CIRCUIT PACKAGE ASSEMBLY

[75] Inventors: Nour E. Derouiche, Raleigh, N.C.; Scott Jewler, Gilbert, Ariz.

[73] Assignee: Mitsubishi Semiconductor America, Inc., Durham, N.C.

[21] Appl. No.: 572,922

[22] Filed: Dec. 15, 1995

[51] Int. Cl.⁶ .............................. H05K 7/02; H05K 7/12; H01L 23/02; H01L 23/34
[52] U.S. Cl. .................. 361/735; 174/52.4; 174/138 G; 257/685; 257/686; 257/730; 257/717; 361/730; 361/732; 361/820
[58] Field of Search ..................................... 361/730, 731, 361/732, 735, 740, 759, 801, 820; 257/678, 685, 686, 797, 730, 717; 174/52.4–52.6, 138 G; 437/915; 439/68, 70, 928, 928.1, 525, 526

[56] References Cited

U.S. PATENT DOCUMENTS

| | | |
|---|---|---|
| 4,696,525 | 9/1987 | Coller et al. . |
| 5,128,831 | 7/1992 | Fox, III et al. . |
| 5,279,029 | 1/1994 | Burns . |
| 5,287,000 | 2/1994 | Takahashi et al. . |
| 5,347,428 | 9/1994 | Carson et al. .......................... 361/735 |
| 5,377,077 | 12/1994 | Burns . |
| 5,394,010 | 2/1995 | Tazawa et al. ............................ 257/686 |

FOREIGN PATENT DOCUMENTS

| | | | |
|---|---|---|---|
| 1-144664 | 6/1989 | Japan | 257/686 |
| 2-75179 | 3/1990 | Japan | 439/70 |
| 3-32050 | 2/1991 | Japan | 257/685 |
| 5-152468 | 6/1993 | Japan | 257/686 |
| 6-132445 | 5/1994 | Japan | 257/723 |

*Primary Examiner*—Donald Sparks
*Assistant Examiner*—John B. Vigushin
*Attorney, Agent, or Firm*—Lowe, Price, LeBlanc & Becker

[57] ABSTRACT

SIP or ZIP packages are provided with locking elements of snap fasteners that allow several packages to be attached to each other to produce an IC package assembly. Using a DIP printed circuit board socket, a high density DIP module, for example, a high capacity memory chip, is assembled. The leads of the module are inserted into a motherboard that carries the external conductors to be connected with the inner circuits of the package assembly, and soldered to the motherboard. To make the IC package assembly compatible with a conventional DIP socket, a plastic spacer can be provided between the IC packages. A retaining clip may be used to allow the IC package assembly to be repeatedly inserted and removed to and from the socket without the risk of falling apart.

20 Claims, 20 Drawing Sheets

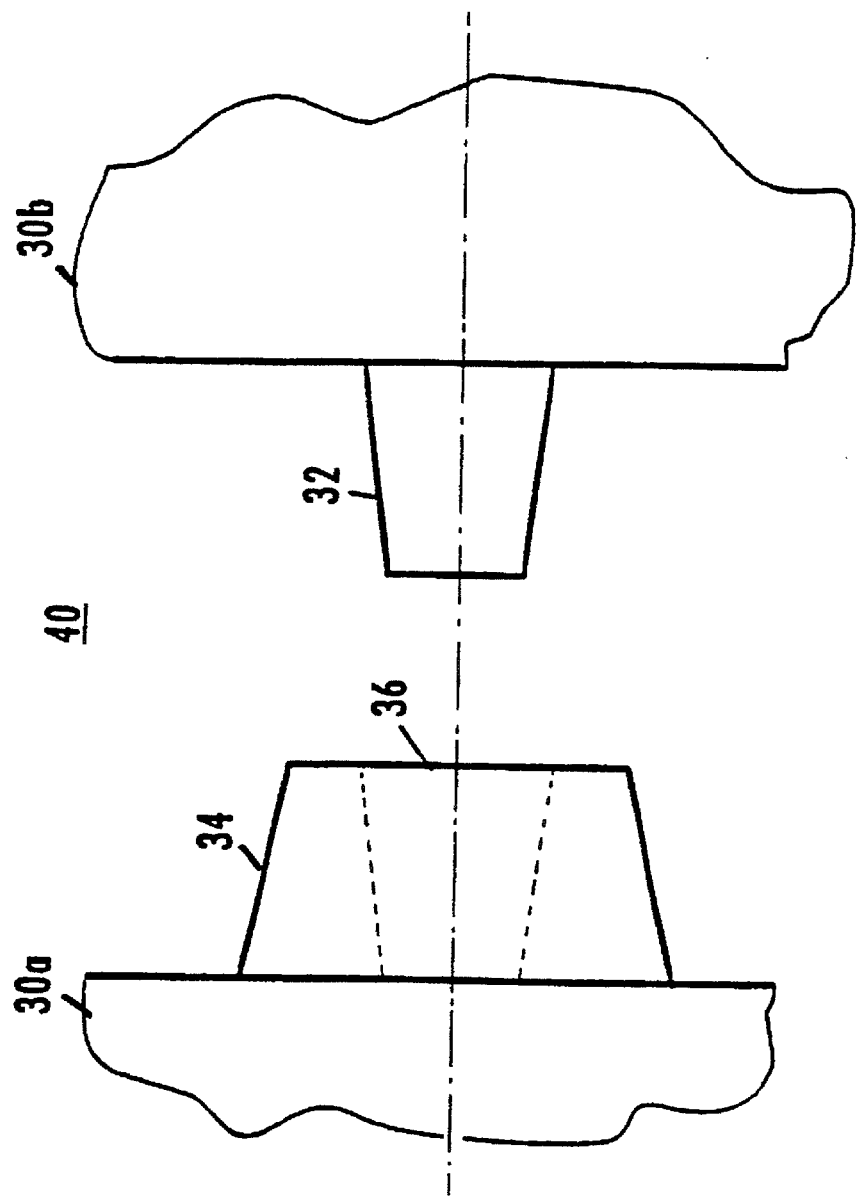

5,623,395

INTEGRATED CIRCUIT PACKAGE ASSEMBLY

TECHNICAL FIELD

The present invention relates generally to integrated circuit packaging, and more particularly, to integrated circuit (IC) packages attached to each other to produce an IC package assembly.

BACKGROUND ART

In an electronic system, components must be mounted on some interconnection network for communication to other parts of the system. The components of various types and configurations can be attached to a printed circuit board (PCB) to make the board a functional electronic device. To reduce costs of the assembly, semiautomatic or automatic insertion of components into PCBs are employed. However, multi-leaded components, e.g. integrated circuits, present problems for semiautomatic or automatic assembly because of lack of uniformity of body size and shape, difficulty of maintaining desired lead conditions, and feed problems at the input to insertion mechanisms. Successful mechanized assembly for integrated circuits is being achieved by using relatively standard integrated circuit (IC) packages. For example, dual in-line IC packages (DIP) that have two rows of vertical leads insertable into a PCB may be used for 256K dynamic RAMs.

For dynamic RAMs of 1M or more, zigzag in-line IC packages (ZIP) and single in-line IC packages (SIP) are used. Referring to FIGS. 1A and 1B respectively showing front and bottom views of a ZIP package, this type of IC package has two rows of leads L1–L20 arranged in a zigzag pattern along the bottom edge of the package.

As shown in FIG. 1C, the ZIP package may comprise a semiconductor chip 10 sealed by a sealing 12 made of epoxy resin. The leads L1–L20 may be connected to bonding pads of the chip 10 using gold wires. For example, a 1M×9 or 4 M×9 RAM may be incorporated into the chip 10. As shown in FIG. 2, a SIP package has a single row of leads aligned along the bottom edge.

Suitable packages for an integrated circuit must satisfy a series of requirements. They must be strong enough mechanically to withstand the stresses occurring during use and provide easily established and reliable electrical connection from the circuit inside to the outer world.

To provide an IC package assembly, for example, a memory module of very high capacity, a group of IC packages are usually assembled on a printed circuit (PC) carrier interconnected with a system PCB that carries the circuits to be connected with the inner circuits of the IC packages. FIG. 3 illustrates an example of a module having nine IC packages 20 mounted on a PC carrier 22 inserted into a system PCB 24. Soldering is used for attaching the IC packages to the PC carrier. However, the manufacturing of the PC-based assembly is a very demanding and expensive technological endeavor requiring sophisticated processes and machinery. In particular, the manufacturing sequence may incorporate the steps of solder paste application, solder paste baking out, reflow soldering, solvent cleaning and final inspection.

Moreover, a multi-package IC assembly based on a PC carrier has a high profile with respect to a system PCB. For some applications, for example, for laptop and notebook computers, and other portable systems, this is unacceptable because of size constraints.

Further, due to high packaging densities, heat generated within the packages can damage the packaged circuit. Metal heat sinks or other heat transfer means should be bonded to the PC carrier to absorb and disperse heat from operating IC packages. As a result, packaging density is reduced and manufacturing cost is increased.

Therefore, it would be desirable to provide a low-cost, high-density and low-profile IC package assembly that can replace a conventional PC-based assembly.

DISCLOSURE OF THE INVENTION

Accordingly, one advantage of the present invention is in providing an IC package assembly with high packaging density.

Another advantage of the present invention is in providing an IC package assembly having a low profile with respect to a motherboard.

Still another advantage of the present invention is in providing the high-density, low-profile IC package assembly that is low in cost and easily implemented.

The above and other advantages of the invention are achieved, at least in part, by providing an electronic package assembly comprising a plurality of IC packages, for example, SIP or ZIP packages. Locking elements are mounted on side walls of the IC packages for attaching them to each other. The IC packages are rigidly oriented by the locking elements so as to establish a prescribed alignment of the IC packages with respect to each other. A socket connector may couple the IC packages with external conductors.

Preferably, a pair of said locking elements constitutes a snap fastener for firmly fixing together a pair of the IC packages. The locking elements may be made of elastic material to provide tight side-by-side engagement of the IC packages.

In accordance with one aspect of the invention, to provide compatibility of the IC packages with a conventional DIP socket, a plastic spacer is fixed between a pair of the IC packages to align the leads of the IC packages with respect to female contacts of the socket. The spacer comprises a parallelepiped frame having openings to provide an air flow for cooling the IC packages. The locking elements are mounted on the side surfaces of the spacer for attaching the IC packages to the spacer.

In accordance with another aspect of the invention, a retaining clip clamps the IC packages together to prevent the assembly composed of the packages from falling apart, when the assembly is repeatedly inserted and removed to and from the socket.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIG. 5 illustrates interaction between male and female locking elements of a snap fastener.

BEST MODE FOR CARRYING OUT THE INVENTION

Although the invention has general applicability in the field of electronic packaging, the best mode for practicing the invention is based in part on the realization of a structure composed of SIP or ZIP packages which have terminals or lead wires only along one edge of the package. However, it is to be understood that the present invention is also applicable to structures that include DIP packages.

Figure 4B:
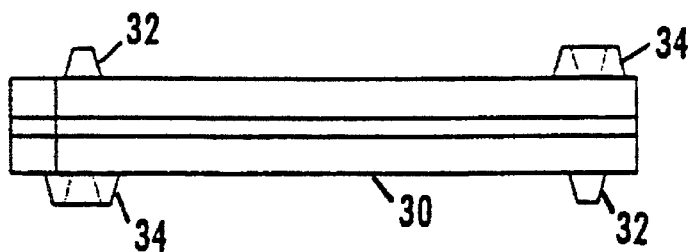
FIGS. 4A–4C show front, top and side views of a SIP package of the present invention.
Figure 4A:
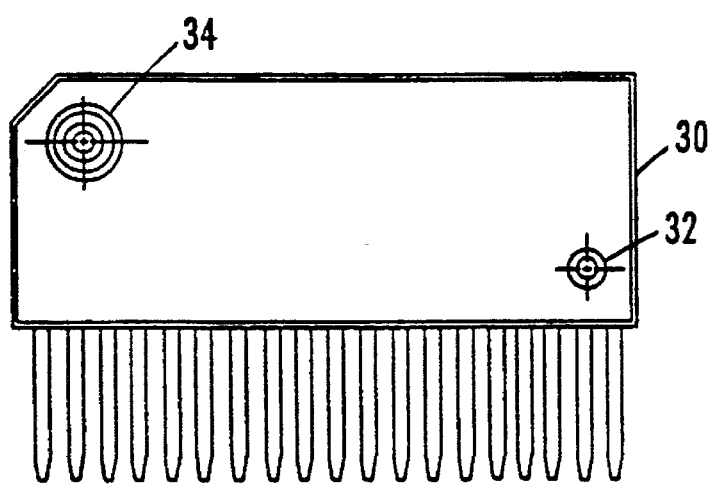
Figure 4C:
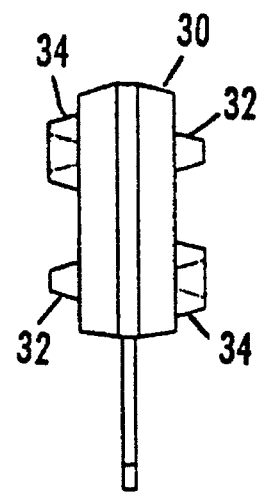

Reference is now made to FIGS. 4A–4C respectively showing front, top and side views of a SIP package 30 with male and female locking elements 32 and 34, respectively, provided on the walls of the package. For example, the front wall shown in FIG. 4A has the male locking element 32 on its top portion, and the female locking element 34 on its bottom portion. By contrast, the rear wall has the male locking element 32 on its top portion, and the female locking element 34 on its bottom portion.

As shown in FIG. 5, the male locking element 32 on a package 30b can be pressed manually or mechanically into an opening 36 of the female locking element 34 on another package 30a to engage the packages 30a and 30b with each other. Simultaneously, the male locking element 32 of the package 30a is pressed into the female locking element 34 of the package 30b. The locking elements 32 and 34 are made of elastic material, e.g. plastic, to provide tight engagement. Hence, each pair of the opposite locking elements on the packages 30a and 30b constitutes a snap fastener 40 for attaching the packages 30a and 30b to each other.

Figure 6:
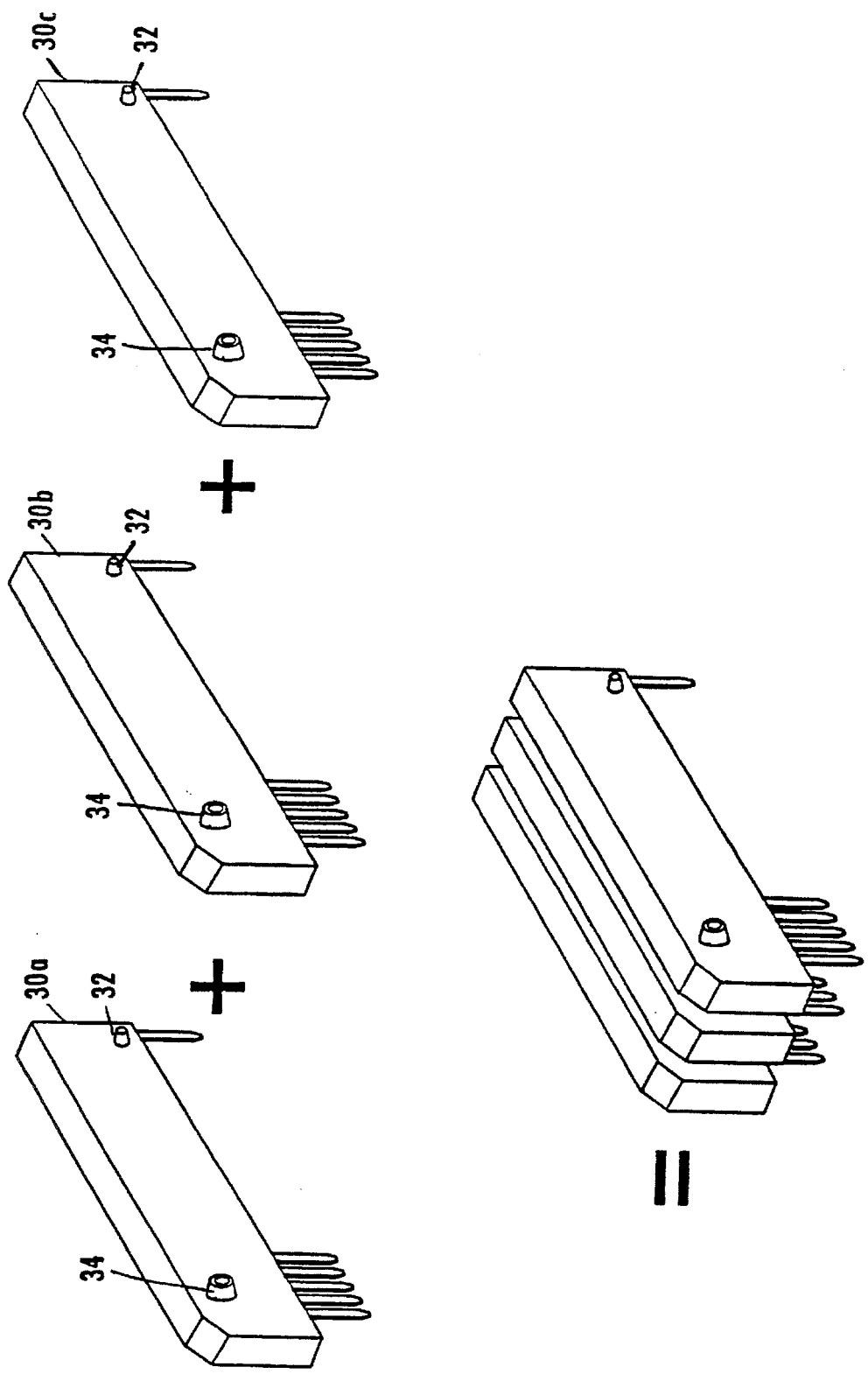
FIG. 6–8 show the packages attached to each other by the snap fasteners to produce IC package assemblies.

As shown in FIG. 6, the locking elements 32 and 34 on the walls of the packages 30a, 30b, and 30c allow these packages to be attached to each other to create an IC assembly without PCB. For example, a 1M×9 three-package memory array can be assembled using the SIP or ZIP packages 30a, 30b and 30c attached to each other. In such an array, each of the packages 30a and 30b may include a 1M×4 memory chip, whereas the package 30c may comprise a 1M×1 memory chip. Another typical applications for the three-package assembly shown in FIG. 6 are a 4M×9 memory array (composed of two 4M×4 chips and one 4M×1 chip), and a 1M×36 memory array (composed of two 1M×16 chips and one 4M×4 4-CAS (Column Address Select) chip).

Figure 7:
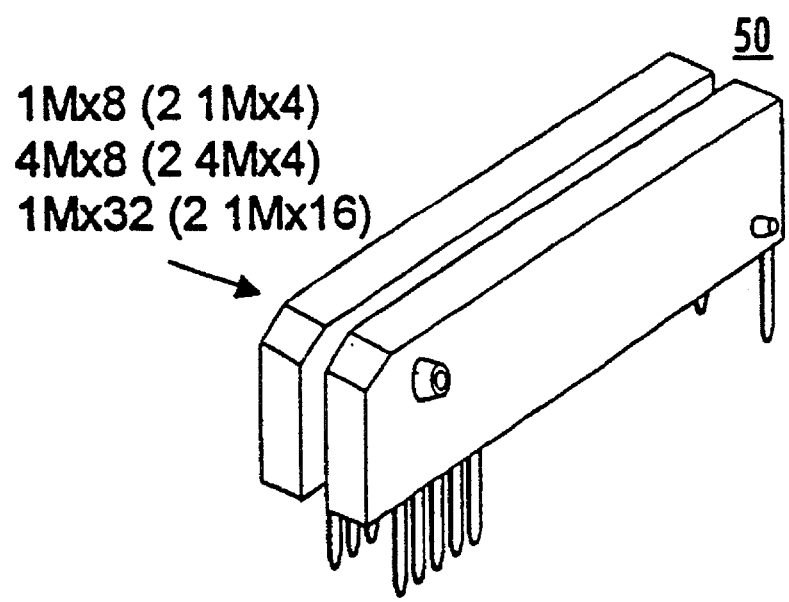
Figure 8:
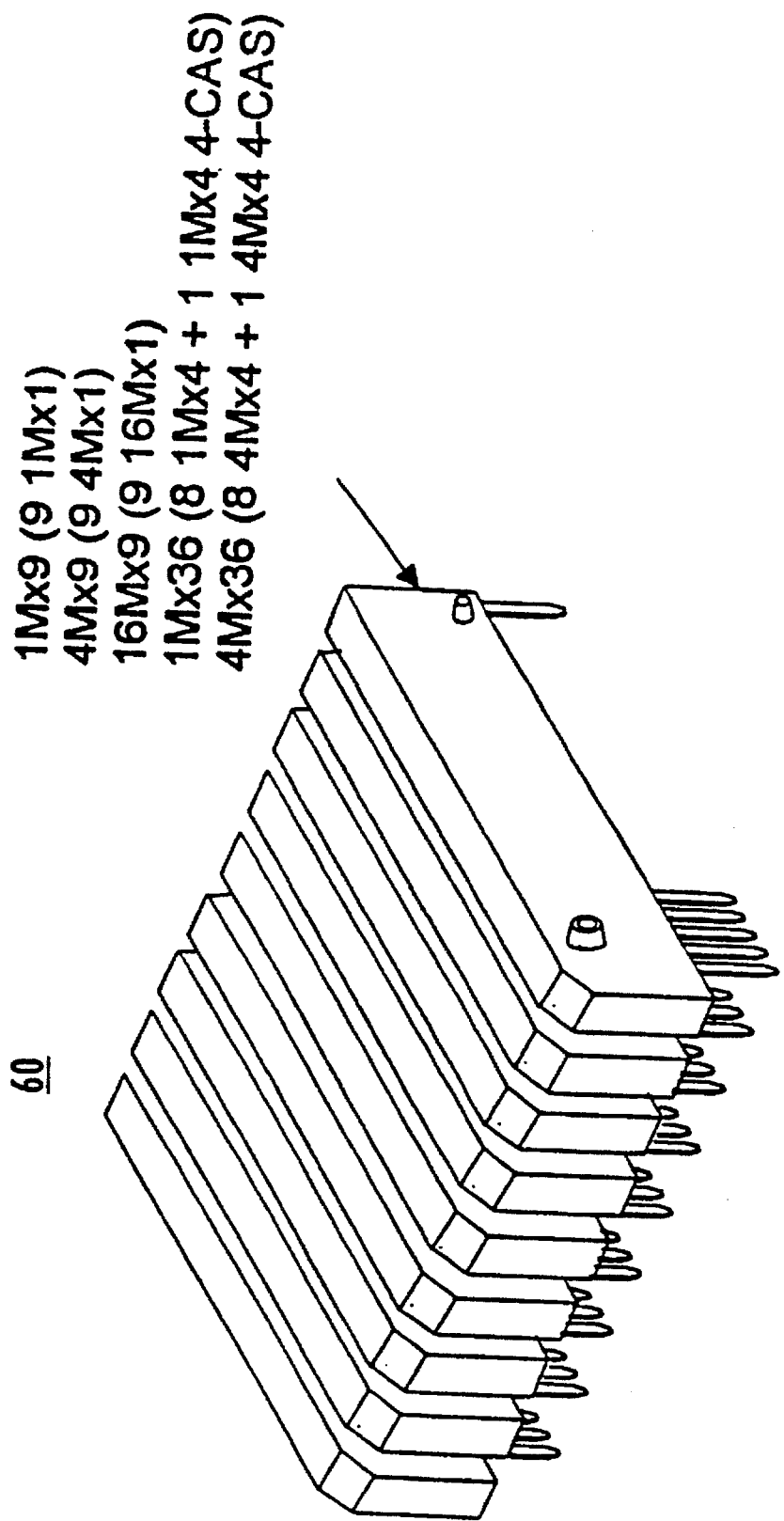

Although FIG. 6 illustrates a set comprising three SIP or ZIP packages, it is to be understood that any number of the packages 30 can be attached to each other. For example, as shown in FIG. 7, a two-package assembly 50 composed of two 1M×4, 4M×4, or 1M×16 memory chips respectively provides a 1M×8, 4M×8, or 1M×32 memory chip set. As shown in FIG. 8, a nine-package assembly 60 may provide, for example, a 1M×9, 4M×9, or 16M×9 memory array respectively composed of nine 1M×1, 4M×1, or 16M×1 memory packages. Also, the nine-package assembly 60 may be, for example, a 1M×36 memory module composed of eight 1M×4 memory packages and one 1M×4 4-CAS memory package, or a 4M×36 memory module composed of eight 4M×4 memory packages and one 4M×4 -CAS memory package.

Figure 9:
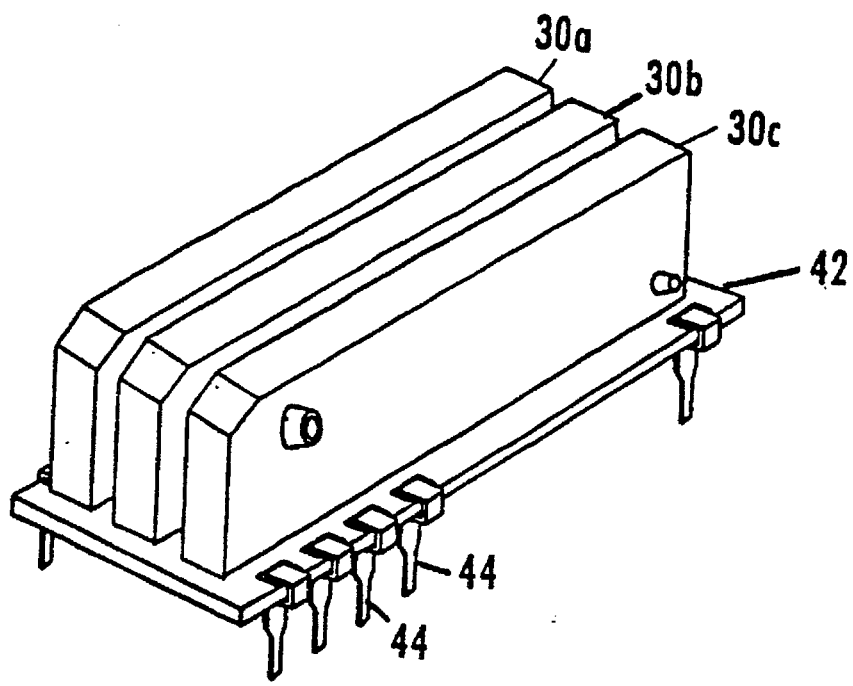
FIG. 9 illustrates the package assembly inserted into a DIP printed circuit socket.

Referring to FIG. 9, the package assembly composed of the SIP or ZIP packages 30a, 30b and 30c attached to each other may be inserted into a printed circuit board DIP socket 42 having two rows of vertical leads 44. Hence, a high density DIP package assembly based on SIP or ZIP packages can be produced. The leads 44 can be inserted into a motherboard that carries the external conductors to be connected with the inner circuits of the package assembly, and soldered to the motherboard. Alternatively, the leads 44 can be inserted into a conventional DIP socket mounted on a motherboard.

Figure 10A:
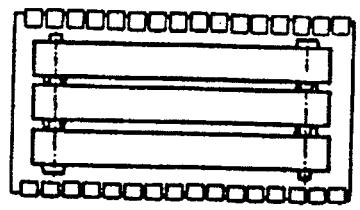
FIGS. 10A and 10B illustrate the high packaging density of the package assembly of the present invention in compare with a conventional package assembly.
Figure 10A:
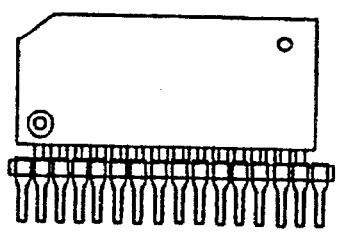
Figure 10B:
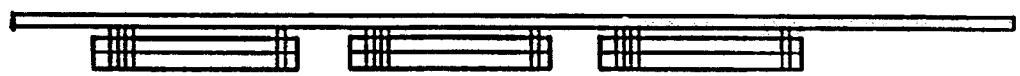
Figure 10B:
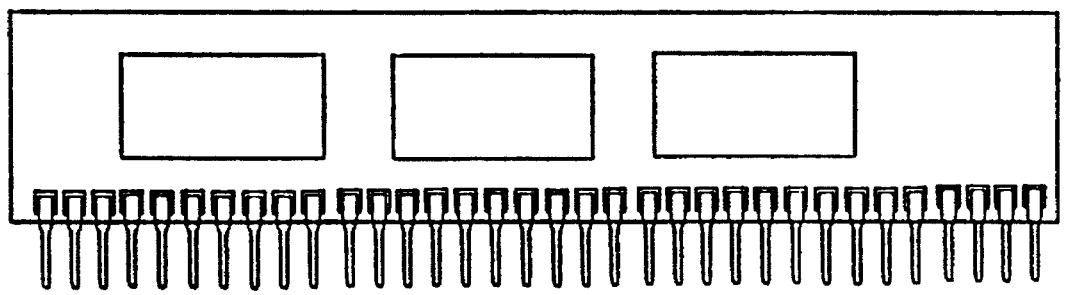

Referring to FIGS. 10A–10B that respectively show exemplary front and top views of a 1M×9 three-package DIP module of the present invention, and front and top views of a conventional 1M×9 three-chip leaded module, the package assembly of the present invention requires substantially less space on a circuit board than the conventional module. Accordingly, much higher packaging density can be provided.

Figure 1A:
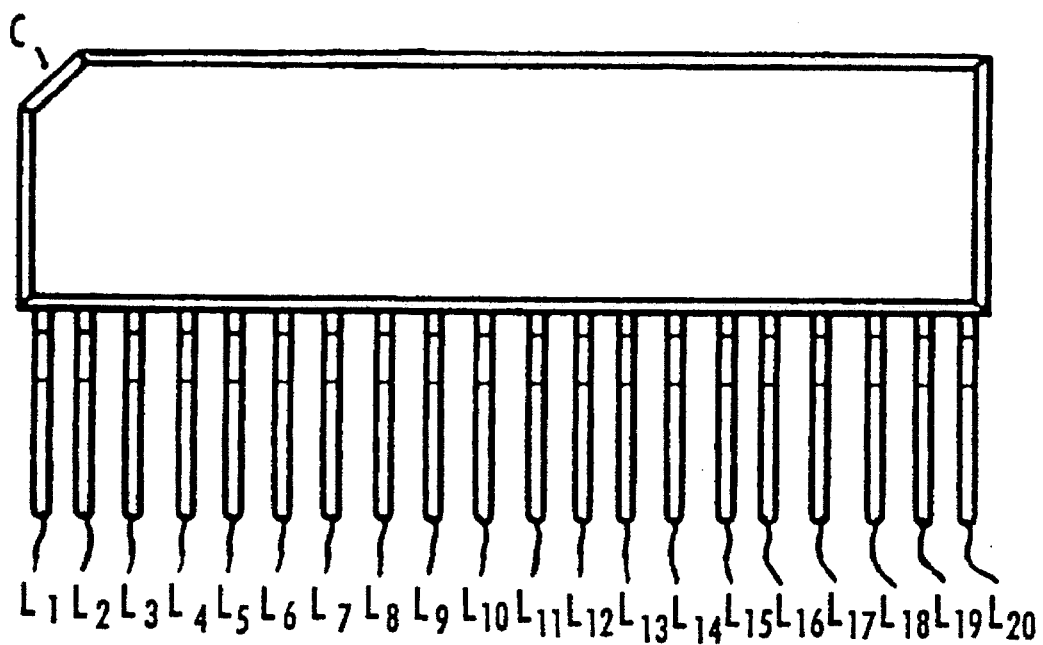
FIGS. 1A–1B show front and bottom views of a ZIP package.
Figure 1B:
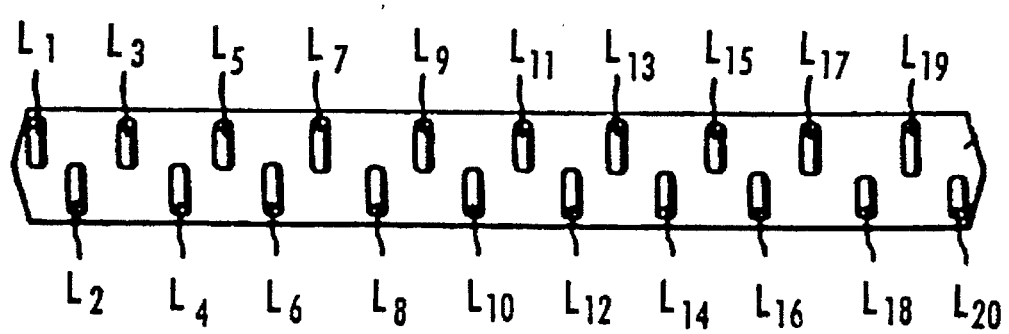
Figure 1C:
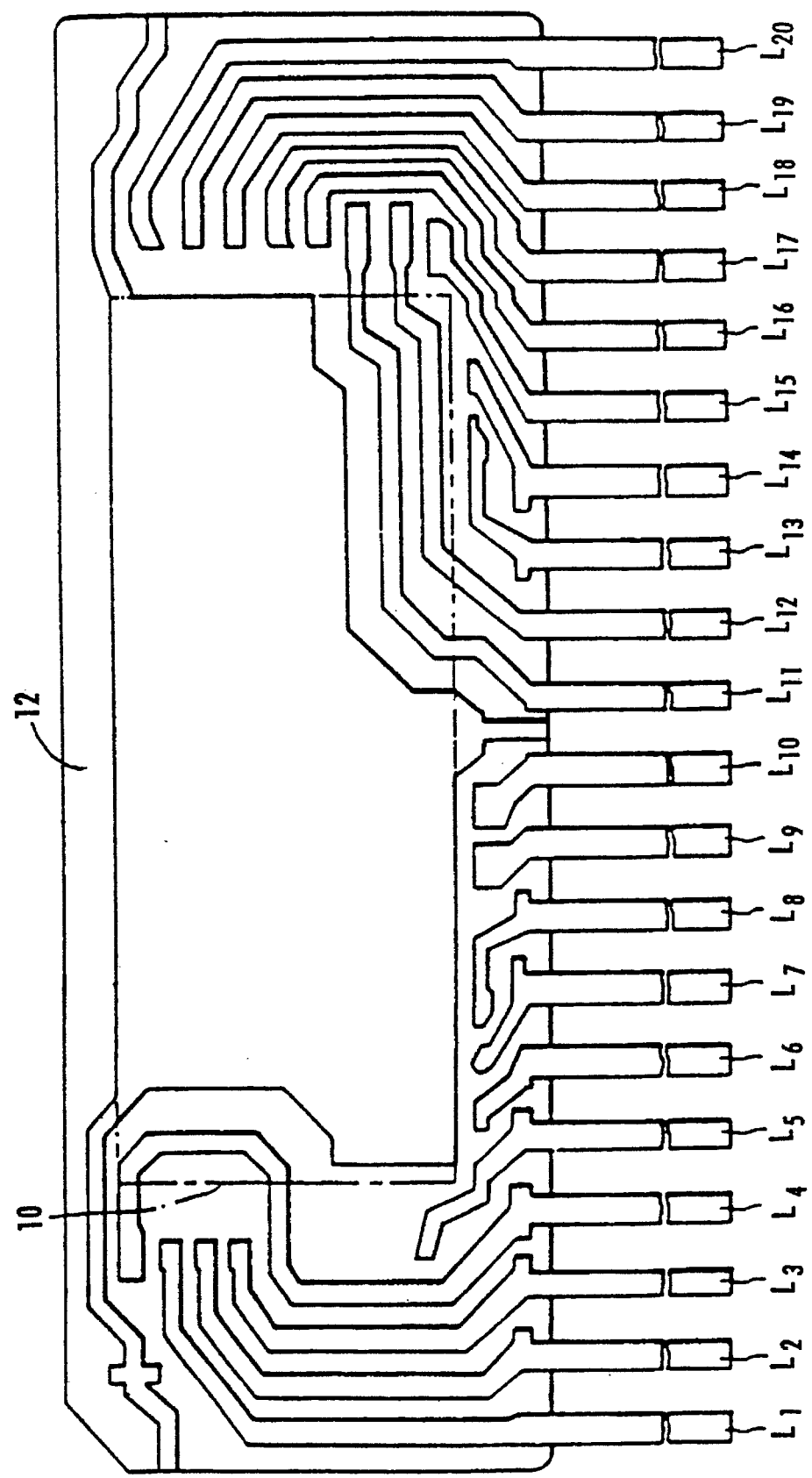
FIG. 1C illustrates an exemplary internal structure of the ZIP package shown in FIGS. 1A–1B.
Figure 2:
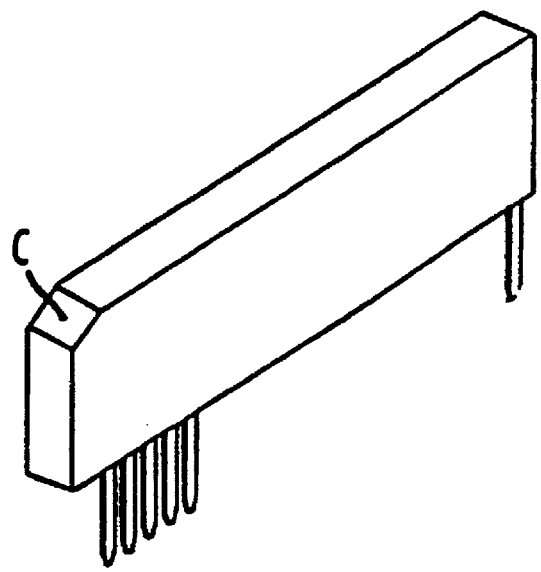
FIG. 2 shows an example of a SIP package.
Figure 3:
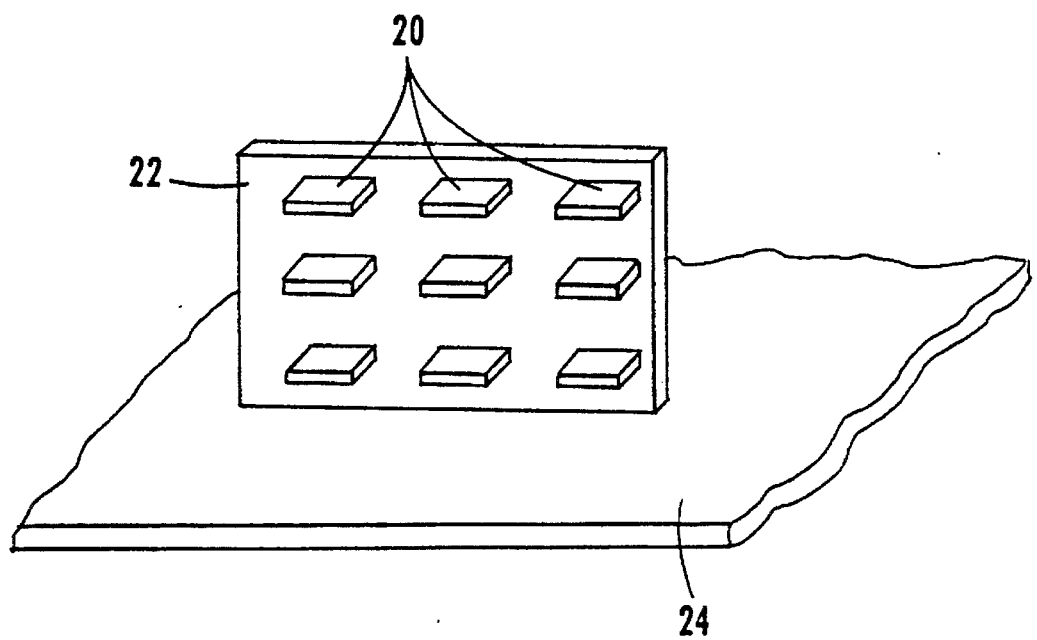
FIG. 3 illustrates a module mounted on a PC carrier.
Figure 11:
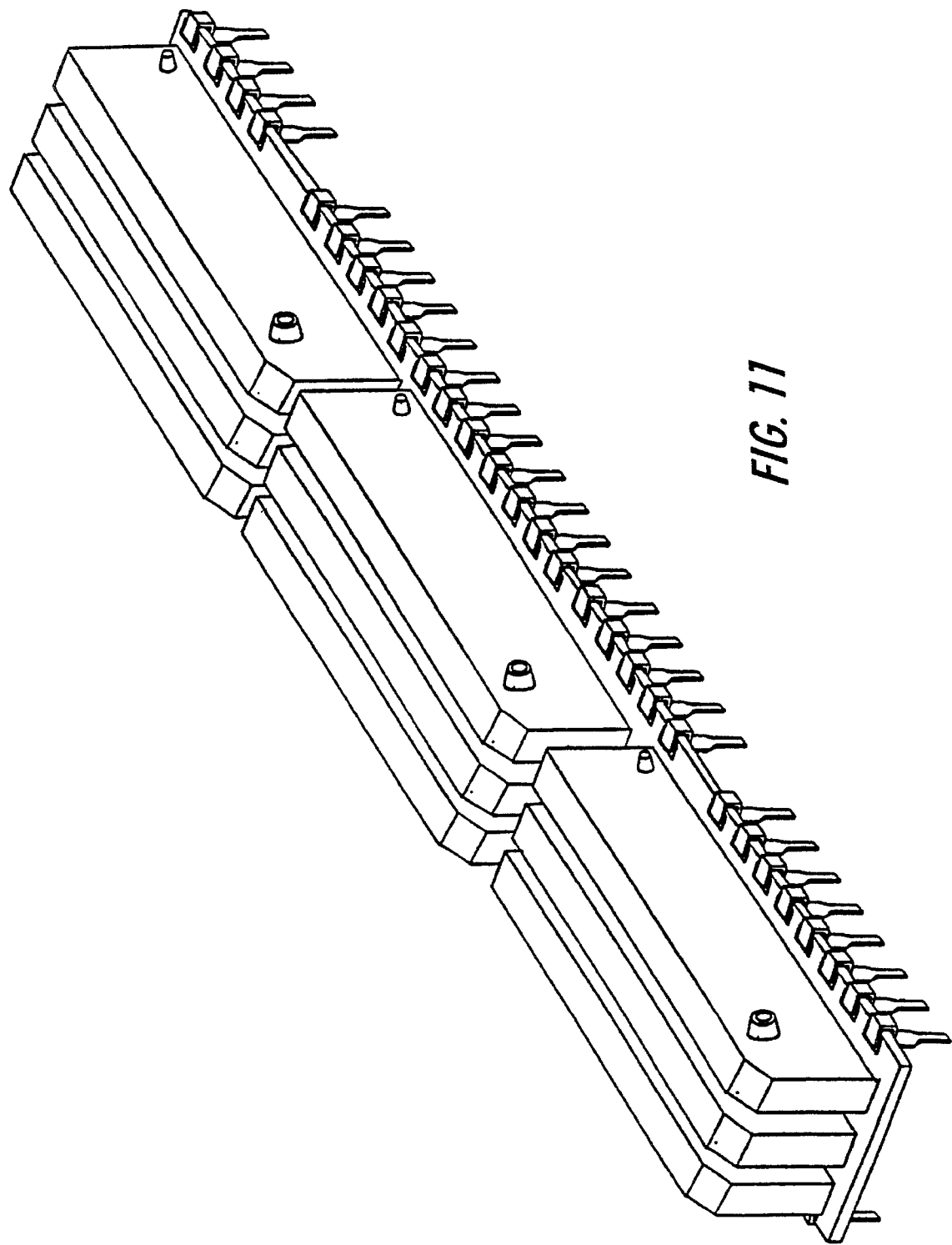
FIG. 11 illustrates the low profile of the package assembly of the present invention in compare with a conventional package assembly.

FIG. 11 shows an example of a nine-package DIP assembly of the present invention which illustrates that the present invention allows the profile of the IC assembly to be substantially reduced compared with the conventional nine-package assembly shown in FIG. 3.

Figure 12:
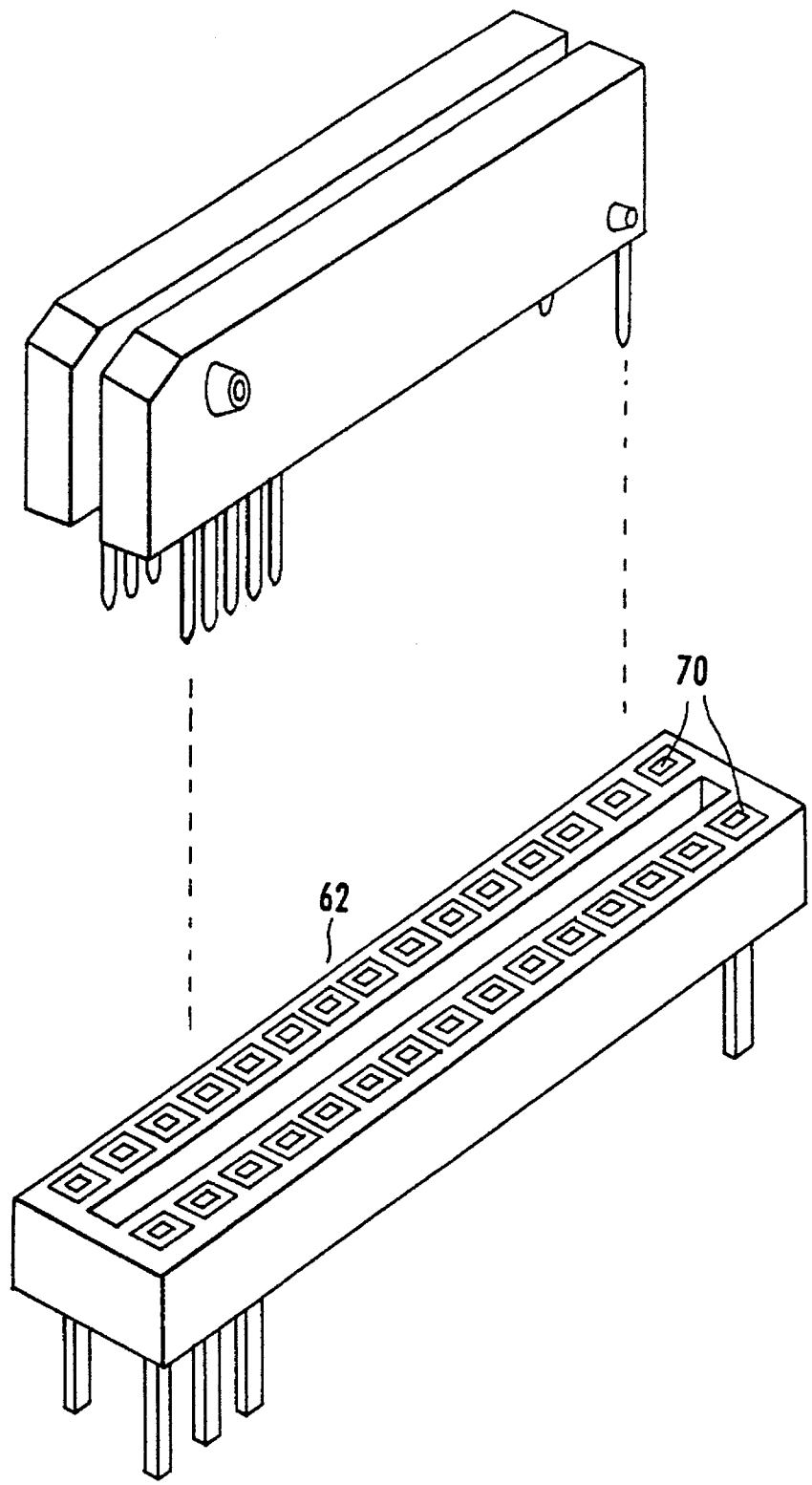
FIGS. 12–14 show custom-designed sockets used with the IC package assembly.
Figure 13:
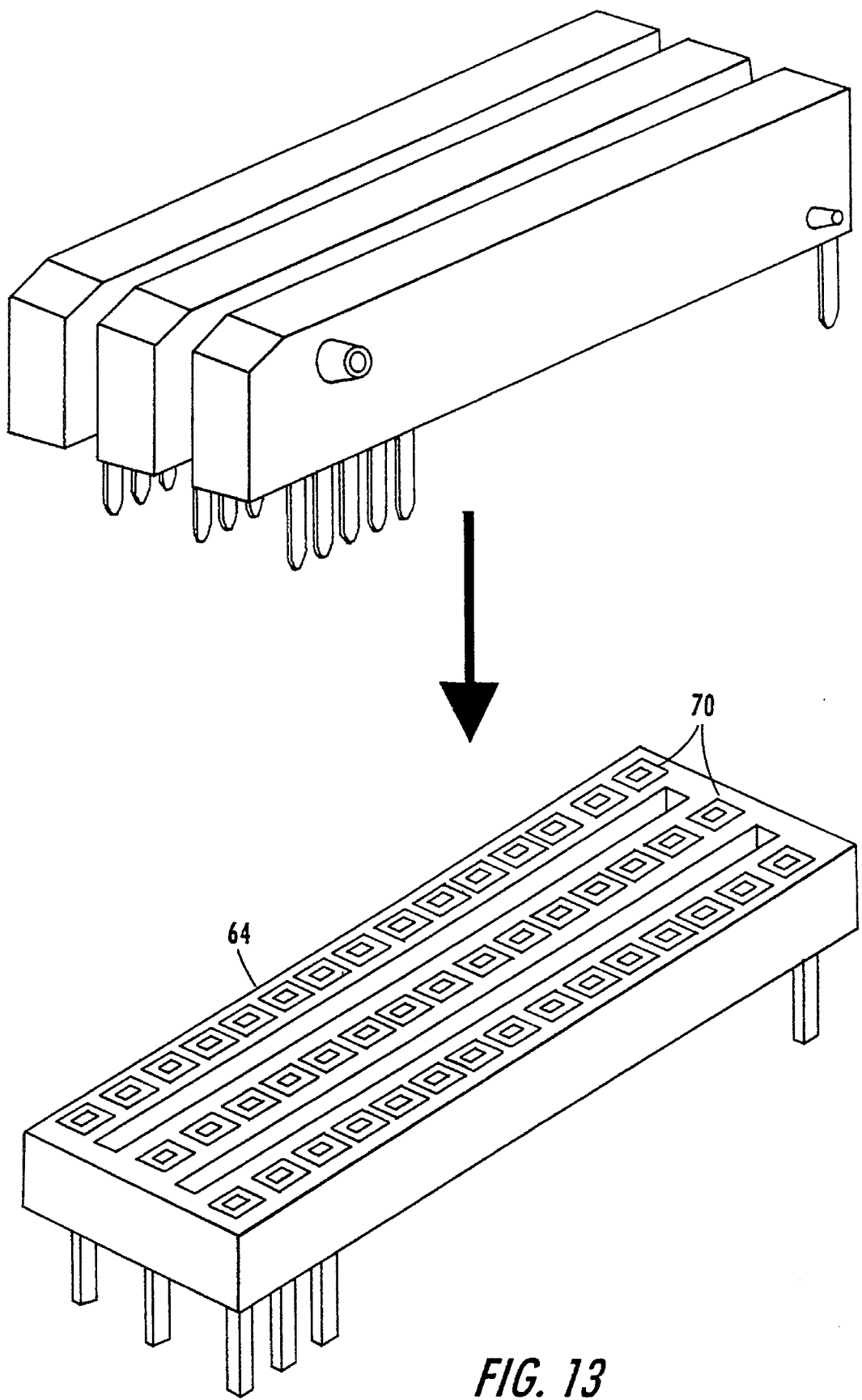
Figure 14:
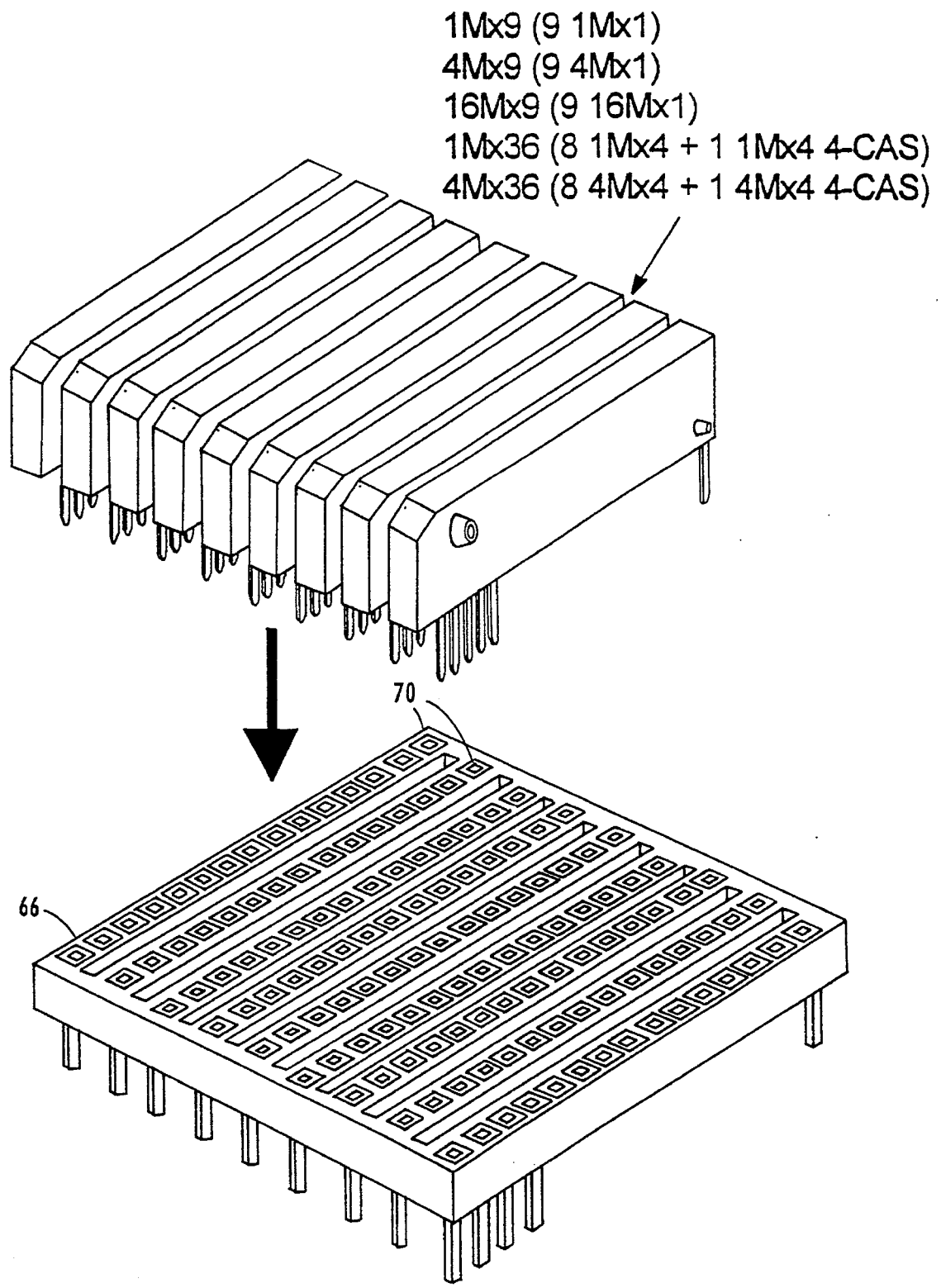

In accordance with a second embodiment of the present invention, the IC package assembly composed of several SIP or ZIP packages attached to each other using the snap fasteners 40, can be directly inserted into a custom-designed socket mounted on a motherboard that carries the external conductors to be connected with the inner circuits of the package assembly. For example, FIGS. 12, 13 and 14 respectively illustrate the custom-designed sockets 62, 64 and 66 for two-package, three-package and nine-package assemblies composed of SIP packages. Each of the sockets 62–66 has several rows of female contacts adapted to receive the leads of the SIP packages. The number of the rows corresponds to the number of packages in an IC package assembly. For example, the socket 62 in FIG. 12 has two rows of female contacts 70 to receive two SIP packages, the socket 64 in FIG. 13 has three rows of female contacts 70 to accommodate three SIP packages, and the socket 66 in FIG. 14 contains nine rows of female contacts 70 for receiving nine SIP packages. The distance between adjacent rows is selected so as to accommodate corresponding adjacent packages attached to each other using snap fasteners.

Figure 15:
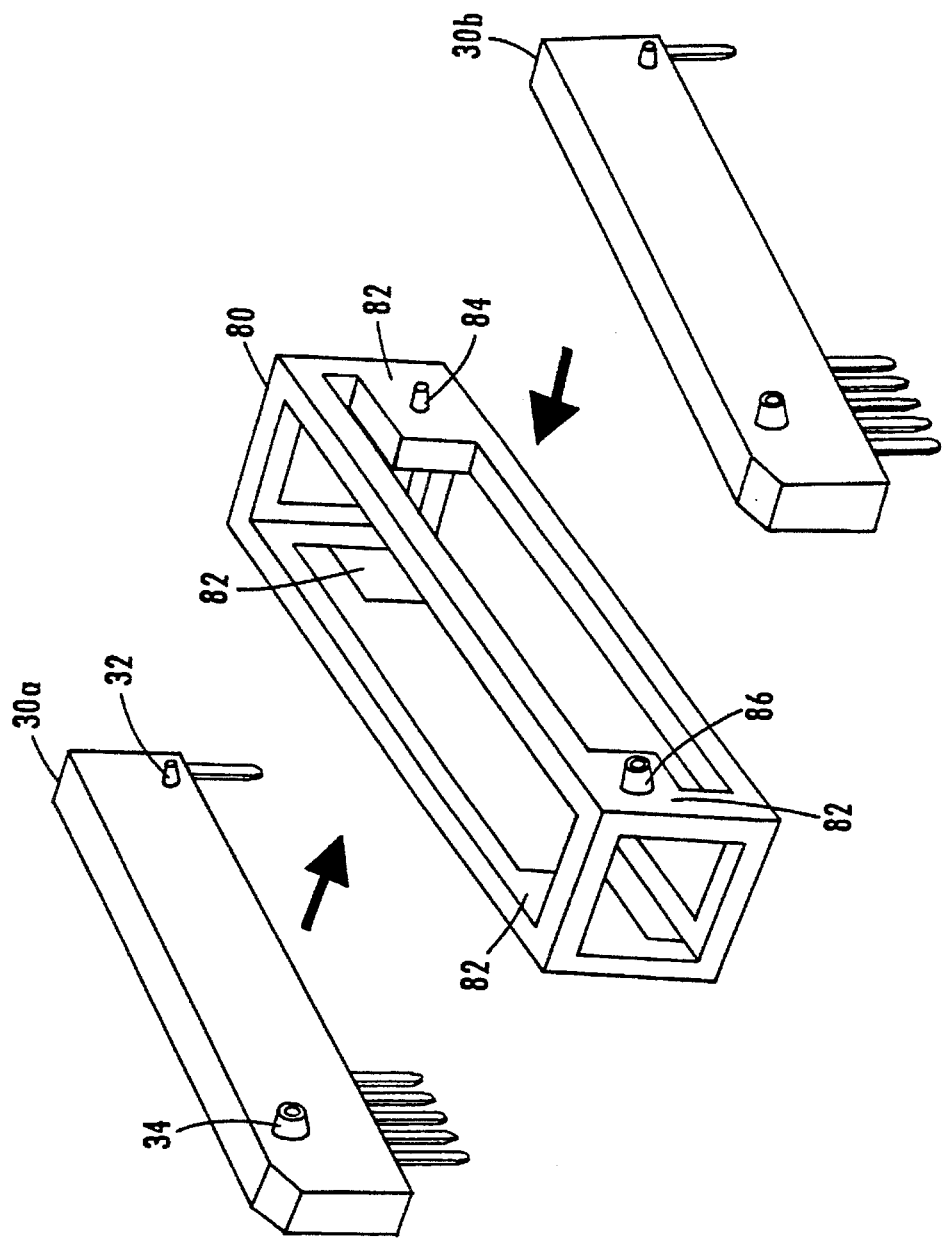
FIGS. 15 and 16 illustrate a plastic spacer used with the IC package assembly.

Referring to FIG. 15, in accordance with a third embodiment of the present invention, a spacer 80 is provided between the SIP packages 30a and 30b. The spacer 80 comprises a parallelepiped frame having openings on its front, rear, top and bottom surfaces to provide an air flow for cooling the SIP packages and allow heat generated within the SIP packages to dissipate. The frame is made of elastic material, for example, plastic. Each side wall of the spacer 80 has an opening and two portions 82 provided at the opposite corners. Male and female locking elements 84 and 86, respectively, are fixed at each of the wall portions 82 of the both walls to attach the SIP packages 30a and 30b to the opposite walls of the spacer 80. For example, the front side wall shown in FIG. 15 has the male locking element 84 on its bottom portion and the female locking element 86 on its top portion. By contrast, the rear side wall has the female locking element 86 on its bottom portion, and the male locking element 84 on its top portion.

Similarly to the snap fastener engagement shown in FIG. 5, the male locking elements 84 on the opposite walls of the spacer 80 are pressed manually or mechanically into openings of the female locking elements 34 on the SIP packages 30a and 30b, whereas the male locking elements 32 on the SIP packages 30a and 30b are pressed into the female locking elements 86 on the opposite walls of the spacer 80.

Figure 16:
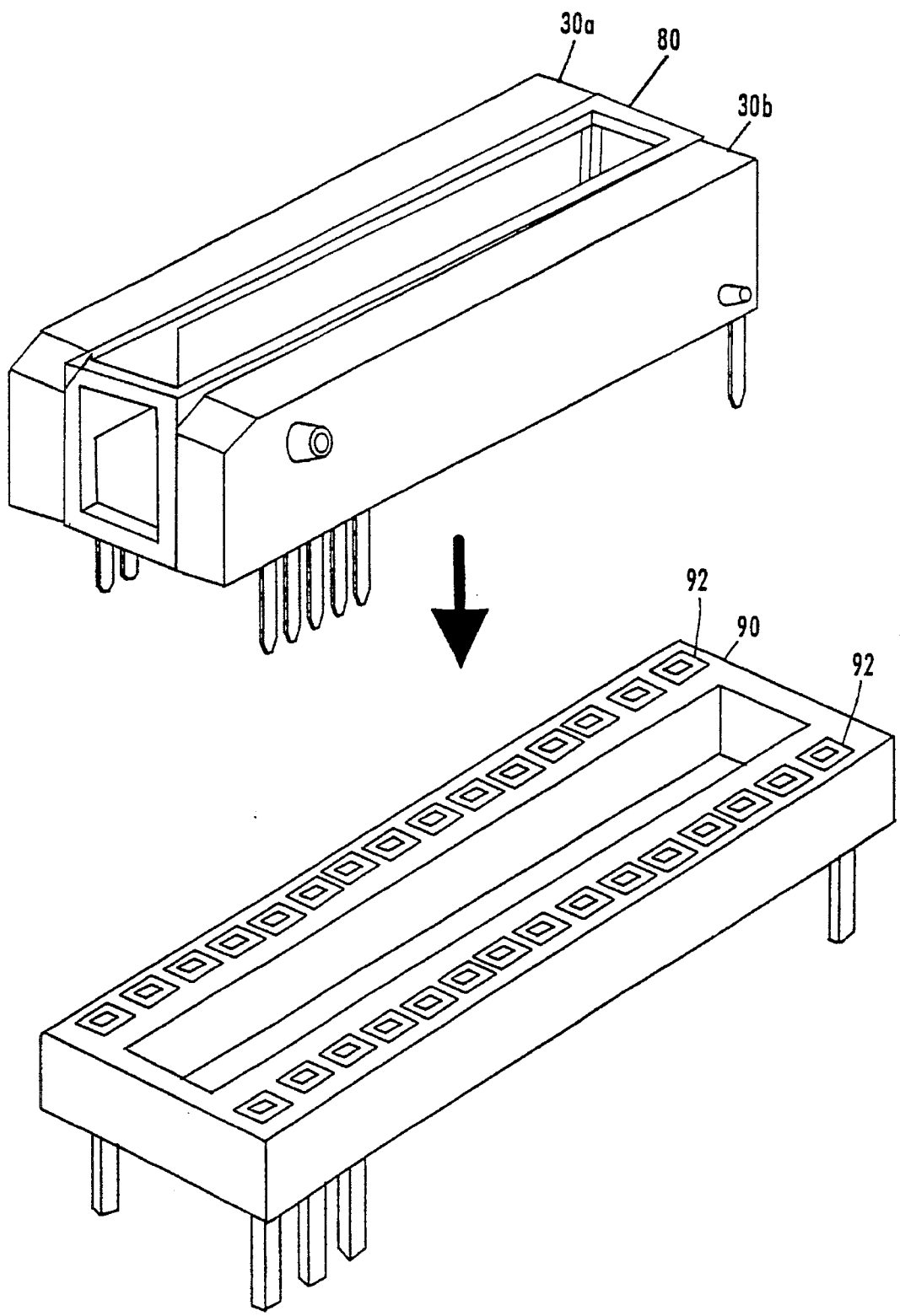

Referring to FIG. 16, the package assembly composed of the SIP packages 30a and 30b, and the spacer 80 provided therebetween, can be inserted into a conventional DIP socket 90 having a prescribed distance between two rows of female contacts 92. The size of the spacer is selected so as to establish alignment of the packages 30a and 30b with the two rows of female contacts 92, in order to allow the leads of the packages 30a and 30b to be inserted into the female contacts 92. Hence, the spacer 80 makes the IC package assembly compatible with a conventional DIP socket, to reduce the cost of the IC module.

Figure 18C:
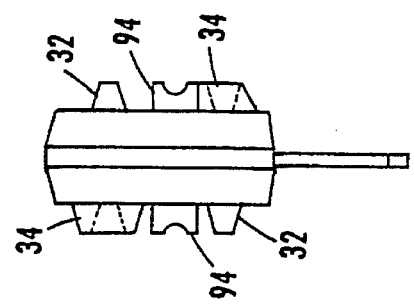
FIGS. 17 and 18A–18C show a SIP package having holding elements to support a retaining clip.
Figure 18B:
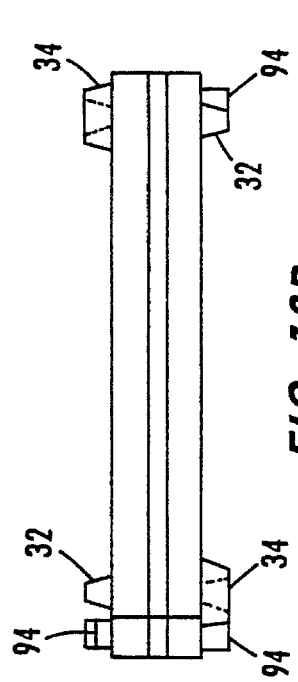
Figure 18A:
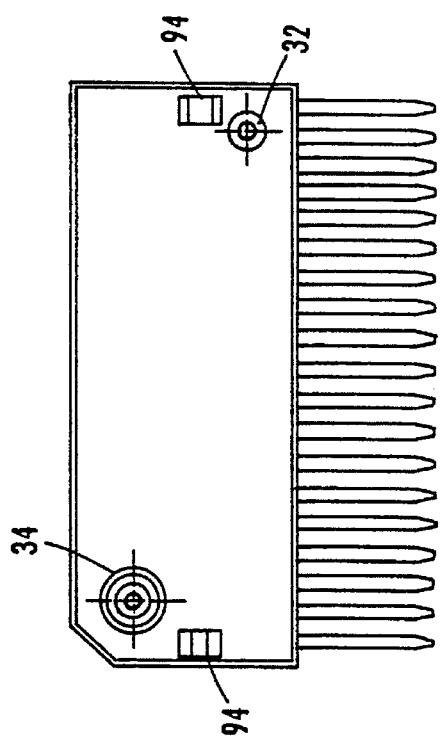
Figure 17:
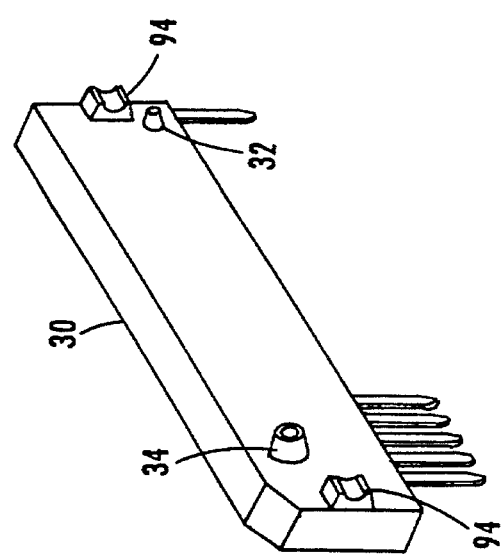
Figure 19:
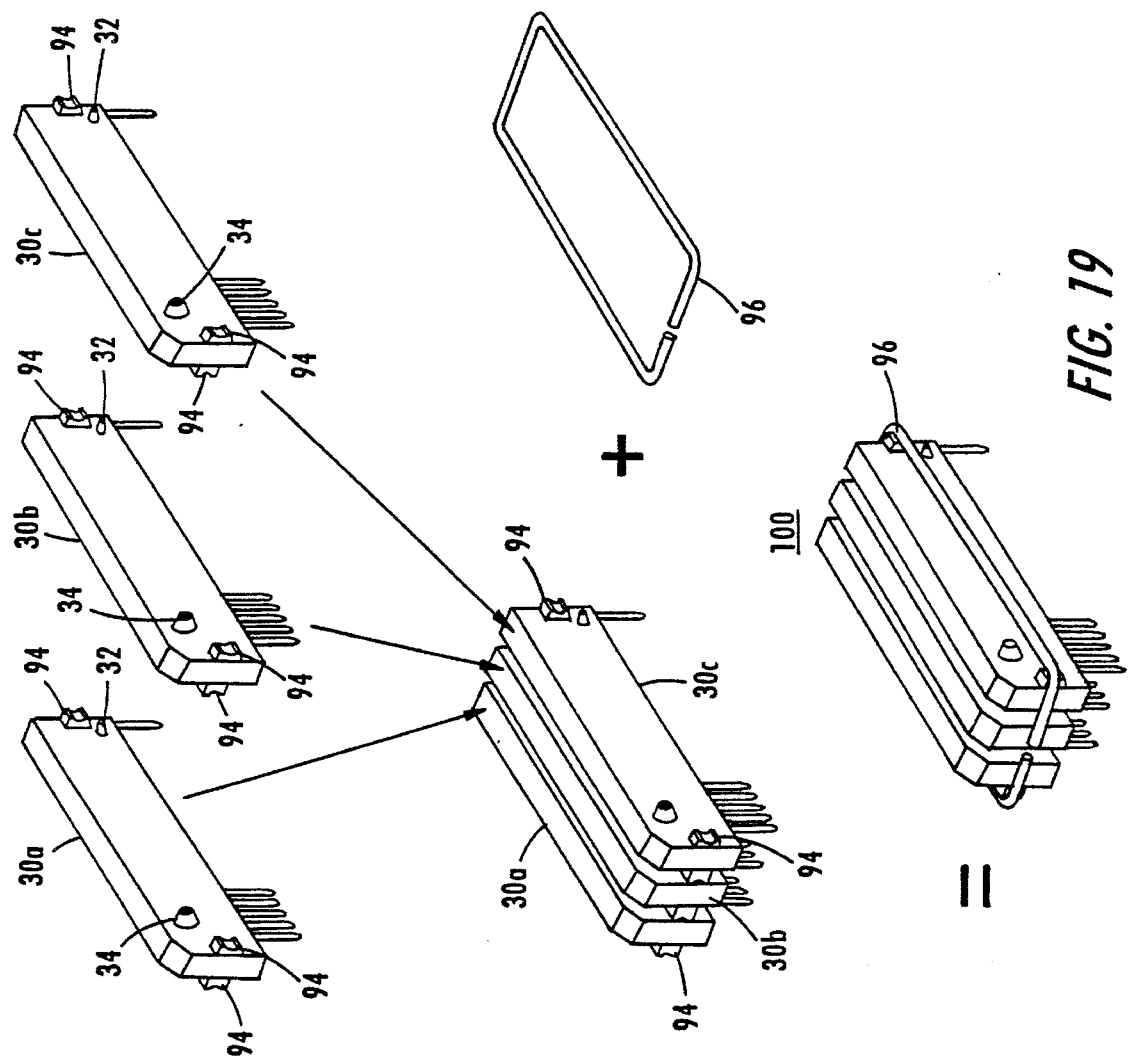
FIG. 19 illustrates an IC package assembly having the retaining clip.

Reference is now made to FIGS. 17–19 illustrating a fourth embodiment of the present invention, wherein the IC package assembly is provided with a retaining clip that prevents the packages from coming apart when the assembly is removed from a socket. As shown in FIG. 17, the SIP package 30 having the male and female locking elements 32 and 34 is provided with holding elements 94 for supporting the retaining clip. Referring to FIGS. 18A, 18B and 18C that respectively show front, top and side views of the SIP package 30, the holding elements 94 are fixed on the edges of the both walls of the package 30 to make the packages in the IC assembly interchangeable.

As illustrated in FIG. 19, the SIP packages 30a, 30b and 30c with the holding elements 94 can be combined into the IC packet assembly, similar to the assembly shown in FIG. 6, using the male and female locking elements 32 and 34. The assembly is clamped with a wire clip 96 held by the holding elements 94 on the outermost packages 30a and 30c to produce an IC packet assembly 100 fixed by the retaining clip.

Figure 20:
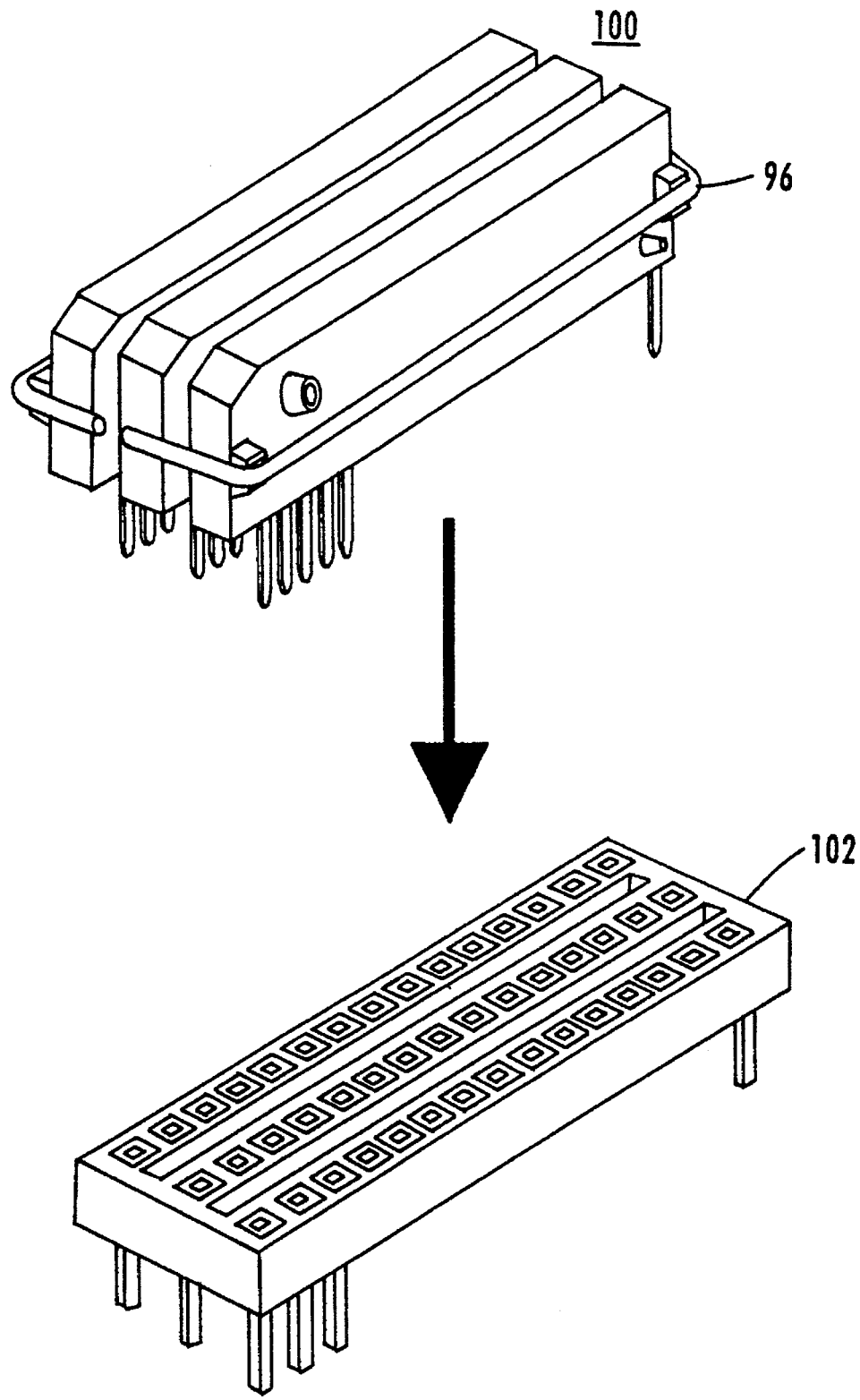
FIG. 20 illustrates insertion of the IC package assembly having the retaining clip into a socket.

Referring to FIG. 20, the IC packet assembly 100 may be inserted into a socket 102 mounted on a motherboard carrying external conductors to be connected to the inner circuits of the assembly. The retaining clip 96 allows the assembly to be repeatedly inserted and removed to and from the socket 102 without the risk of falling apart. Although FIGS. 19 and 20 illustrate the IC assembly comprising three SIP packages, it is to be understood that any number of the SIP or ZIP packages attached to each other by the locking elements 32 and 34 can be clamped by the wire clip 96 held by the holding elements 94 on the outermost packages in the assembly.

In summary, the results and advantages of the IC package assemblies of the present invention can now be more fully appreciated. Each SIP or ZIP IC package is provided with locking elements of snap fasteners that allow several IC packages to be attached to each other to produce an IC package assembly. Using a DIP printed circuit board socket, a high density DIP module, for example, a high capacity memory chip, can be assembled. The leads of the module may be inserted into a motherboard that carries the external conductors to be connected with the inner circuits of the package assembly, and soldered to the motherboard. To make the IC package assembly compatible with a conventional DIP socket, a plastic spacer can be provided between the IC packages. A retaining clip may be used to allow the IC package assembly to be repeatedly inserted and removed to and from the socket without the risk of falling apart.

Accordingly, the high density IC package assembly having a low profile with respect to a motherboard can be produced.

It will also be recognized that the IC package assembly of the present invention is low in cost and can be easily implemented.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

We claim:

1. An electronic package assembly comprising:

a plurality of IC packages having leads arranged along, at least, one edge of each of the IC packages, and locking elements for attaching the IC packages to each other, and a socket connector for receiving the leads to connect said plurality of IC packages with a set of external conductors, the IC packages being rigidly oriented by said locking elements so as to establish a prescribed alignment of the IC packages with respect to each other and said connector.

2. The assembly of claim 1, wherein at least a pair of said locking elements constitutes a snap fastener for firmly fixing together a pair of the IC packages.

3. The assembly of claim 1, wherein said locking elements are made of elastic material to provide tight engagement of the IC packages.

4. The assembly of claim 1, wherein said IC packages having side walls, and, at least, two of said locking elements are mounted on each of the side walls to provide a side-by-side engagement between said IC packages.

5. The assembly of claim 1, further comprising a spacer provided between a pair of the IC packages to align the leads of the IC packages with respect to female contacts of the socket connector.

6. The assembly of claim 5, wherein said spacer is made of elastic material.

7. The assembly of claim 5, wherein said spacer is provided with the locking elements for attaching the IC packages to the spacer.

8. The assembly of claim 7, wherein said spacer comprises a parallelepiped frame having openings on its front, rear, top and bottom surfaces to provide an air flow for cooling the IC packages attached to side surfaces of the frame.

9. The assembly of claim 8, wherein, at least, a pair of the locking elements are fixed on each of the side surfaces of the frame to provide side-by-side engagement between the spacer and the IC packages.

10. The assembly of claim 9, wherein said pair of the locking elements are engaged with a pair of the locking elements on the IC packages to establish a prescribed alignment of the IC packages with respect to each other and said spacer.

11. The assembly of claim 10, wherein the locking elements on the spacer and the locking elements on the IC packages constitute snap fasteners for firmly fixing together the spacer and the IC packages.

12. The assembly of claim 1, further comprising a retaining clip for clamping the IC packages together to prevent the assembly composed of said IC packages from falling apart.

13. The assembly of claim 12, wherein each of the IC packages has at least a pair of holding elements for supporting said retaining clip.

14. The assembly of claim 1, wherein said IC packages form a memory module.

15. The assembly of claim 1, wherein said IC packages include SIP packages, and said socket connector includes a DIP socket.

16. The assembly of claim 1, wherein said socket connector includes a custom-designed socket mounted on a motherboard that carries the external conductors.

17. The assembly of claim 16, wherein the custom-designed socket has several rows of female contacts adapted to receive the leads of the IC packages, the number of said rows corresponding to the number of the IC packages in the assembly.

18. The assembly of claim 17, wherein distance between adjacent rows in the custom designed socket are selected so as to accommodate corresponding adjacent IC packages attached to each other.

19. An integrated circuit assembly comprising a plurality of electronic packages having side walls, a pair of male and female locking elements of a snap fastener being mounted on at least one of said side walls for providing side-by-side engagement between said electronic packages to establish a prescribed alignment of said electronic packages with respect to each other or a set of external conductors.

20. An electronic package, comprising:

a body containing electronic elements and having side walls, a plurality of leads arranged along at least one edge of said body for connecting said electronic elements to a set of external conductors, and a pair of male and female locking elements of a snap fastener mounted on at least one of said side walls, said body being rigidly oriented by said locking elements with respect to other electronic packages so as to establish a prescribed alignment between said leads and said set of external conductors.

* * * * *